United States Patent
Graves

(10) Patent No.: US 11,646,652 B1
(45) Date of Patent: May 9, 2023

(54) SWITCHING POWER SUPPLY RECTIFIER WITH VOLTAGE CLAMPS TO CLAMP VOLTAGE TRANSIENTS ON OUTPUT COIL OF TRANSFORMER

(71) Applicant: L3Harris Technologies, Inc., Melbourne, FL (US)

(72) Inventor: Justin M. Graves, Middletown, OH (US)

(73) Assignee: L3Harris Technologies, Inc., Melbourne, FL (US)

( * ) Notice: Subject to any disclaimer, the term of this patent is extended or adjusted under 35 U.S.C. 154(b) by 0 days.

(21) Appl. No.: 17/667,860

(22) Filed: Feb. 9, 2022

(51) Int. Cl.
*H02M 3/335* (2006.01)
*H02M 1/34* (2007.01)
*H02M 7/217* (2006.01)
*H03K 17/0814* (2006.01)

(52) U.S. Cl.
CPC ......... *H02M 1/34* (2013.01); *H02M 3/33576* (2013.01); *H02M 7/217* (2013.01); *H03K 17/08142* (2013.01)

(58) Field of Classification Search
CPC ........................... H02M 1/34; H02M 3/33576
See application file for complete search history.

(56) References Cited

U.S. PATENT DOCUMENTS

| | | | |
|---|---|---|---|
| 6,771,521 B1 | 8/2004 | Xiong et al. | |
| 6,980,447 B1 * | 12/2005 | Schaible | H02M 3/33592 363/56.05 |
| 7,342,811 B2 * | 3/2008 | Domb | H02M 3/33592 363/21.06 |
| 8,450,892 B2 * | 5/2013 | Patel | H02K 19/365 310/71 |
| 9,748,851 B2 * | 8/2017 | Muto | H02M 3/33576 |
| 11,165,351 B1 * | 11/2021 | Yau | H02M 1/342 |
| 2005/0024803 A1 * | 2/2005 | Ying | H02M 3/33576 361/82 |
| 2006/0268585 A1 * | 11/2006 | Domb | H02M 3/33592 363/21.06 |
| 2014/0192569 A1 * | 7/2014 | Espino | H02M 3/33515 363/50 |
| 2017/0244330 A1 * | 8/2017 | Kolar | H02M 3/3376 |
| 2022/0399804 A1 * | 12/2022 | Rehlaender | H02M 3/33592 |

FOREIGN PATENT DOCUMENTS

| | | | | |
|---|---|---|---|---|
| CN | 1734911 A | * | 2/2006 | |
| CN | 114465450 A | * | 5/2022 | |
| DE | 102013211258 A1 | * | 12/2014 | ........ H02M 3/33592 |
| KR | 100207020 B1 | * | 9/1997 | |

* cited by examiner

*Primary Examiner* — Sisay G Tiku
(74) *Attorney, Agent, or Firm* — Edell, Shapiro & Finnan, LLC

(57) ABSTRACT

A circuit to rectify an alternating current (AC) signal produced by an output coil of a transformer responsive to an input current in an input coil of the transformer comprises: an output node and a return node coupled to an output load; a first rectifier, coupled to a first terminal of the output coil and the return node, to rectify the AC signal to supply a current to the output node when the input current is ON; a second rectifier, coupled to a second terminal of the output coil and the return node, to rectify the AC signal to supply a current to the output node when the input current is OFF; and a voltage clamp to clamp a first voltage transient and a second voltage transient of the AC signal that occur at the first terminal and the second terminal when the input current is switched OFF and ON.

19 Claims, 9 Drawing Sheets

US 11,646,652 B1

SWITCHING POWER SUPPLY RECTIFIER WITH VOLTAGE CLAMPS TO CLAMP VOLTAGE TRANSIENTS ON OUTPUT COIL OF TRANSFORMER

TECHNICAL FIELD

The present disclosure relates to voltage clamps for switching power supplies.

BACKGROUND

A switching power supply includes a transformer having a primary winding to receive a switched input current and a secondary winding, followed by a rectifier. Electromagnetic coupling between the primary winding and the secondary winding is imperfect. Such imperfect coupling creates "leakage inductance." Leakage inductance causes voltage spikes or high-level transients on most switching power supply waveforms. Voltage spikes across the rectifier can exceed rectifier ratings or customer allowed voltage stress limits. To mitigate deleterious effects caused by the voltage spikes, designers can use (i) higher voltage diodes, which have a higher forward voltage drop and therefore dissipate more power, (ii) resistor-capacitor (RC) snubbers to turn voltage stress into heat, (iii) clamp windings or active clamp circuitry, and (iv) resistor/capacitor/diode (RCD) clamps. The higher voltage diodes dissipate more power due to their high forward voltage drop, which reduces power supply efficiency. RC snubbers reduce, but do not clamp the transients, and also use large resistors. Clamp windings and active clamp circuitry are complicated and expensive, especially in space applications. RCD clamps may only clamp a freewheeling rectifier diode. At best, the aforementioned solutions are incomplete and may be expensive and/or complicated.

DESCRIPTION OF EXAMPLE EMBODIMENTS

Overview

In an embodiment, a circuit configured to rectify an alternating current (AC) signal produced by an output coil of a transformer in response to an input current in an input coil of the transformer comprises: an output node and a return node to be coupled to an output load; a first rectifier, coupled to a first terminal of the output coil and the return node, to rectify the AC signal to supply a current to the output node when the input current is ON; a second rectifier, coupled to a second terminal of the output coil and the return node, to rectify the AC signal to supply a current to the output node when the input current is OFF; and a voltage clamp, configured to clamp, to a clamp voltage set by the voltage clamp, a first voltage transient and a second voltage transient of the AC signal that occur at the first terminal and the second terminal when the input current is switched OFF and ON, respectively.

In one example, the voltage clamp may include a first clamp diode, a second clamp diode, and a capacitor to establish the clamp voltage, coupled to each other at a common node of the voltage clamp. In another example, the voltage clamp includes a first clamp diode, a second clamp diode, and a Zener diode to establish the clamp voltage, coupled to each other at the common node.

Example Embodiments

Figure 1:
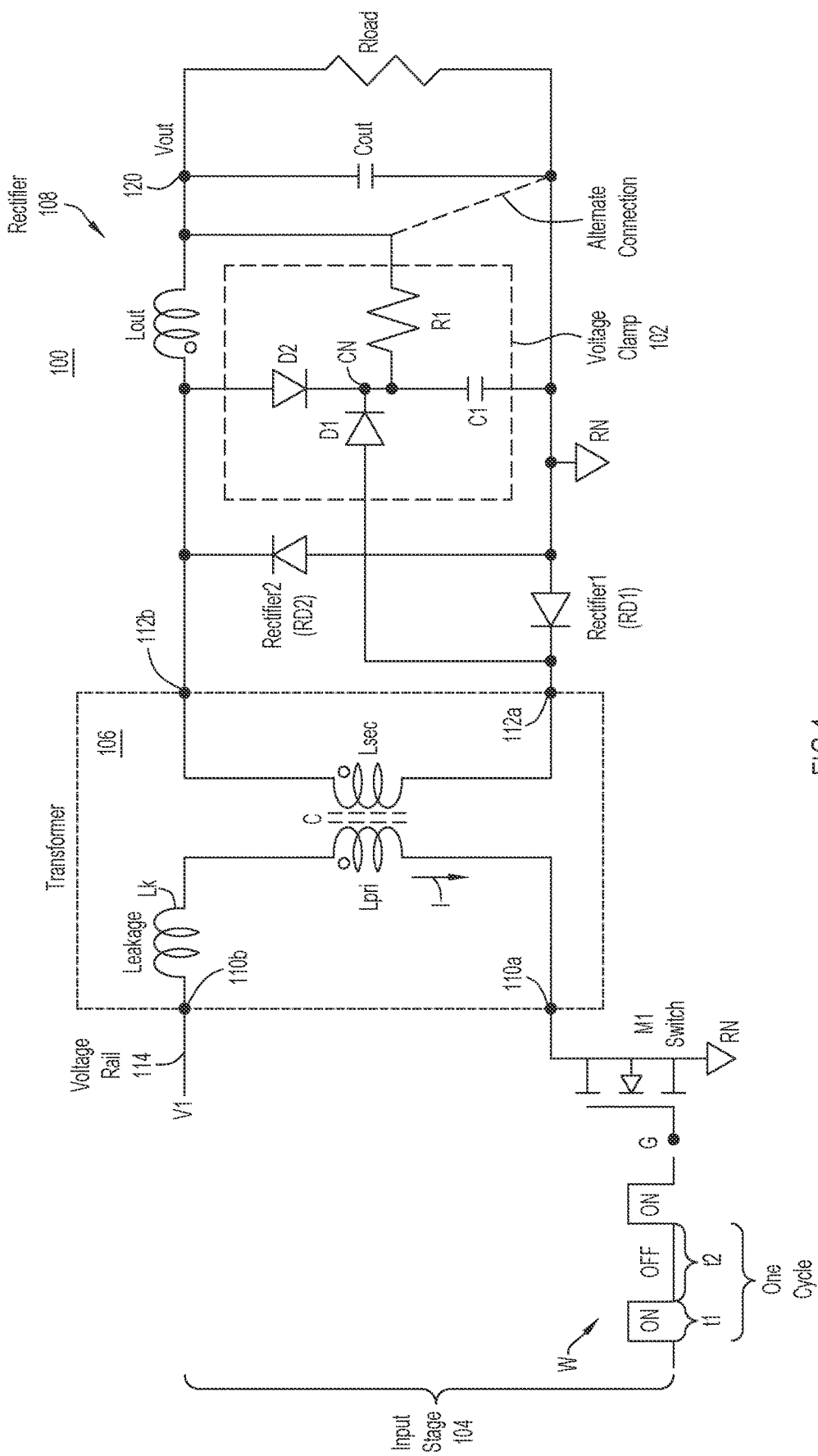
FIG. 1 is a schematic diagram of an example switching power supply system having a voltage clamp of a first embodiment to clamp voltage transients of an alternating current (AC) signal generated by an output coil of a transformer responsive to an input current in an input coil of the transformer.

FIG. 1 is a schematic diagram of an example switching power supply system 100 in which an example voltage clamp 102 according to a first embodiment may be implemented. Switching power supply system 100 includes an input stage 104, a transformer 106 coupled to the input stage, and an output stage or rectifier 108 coupled to the transformer. Input stage 104 applies a switched input current I to transformer 106 under control of a transistor switch M1. Transformer 106 transforms the switched input current to an alternating current (AC) waveform or signal (including current and voltage). Rectifier 108 rectifies the AC signal and supplies a rectified current and voltage to an output load Rload coupled to the rectifier. Additionally, rectifier 108 includes voltage clamp 102 to clamp or hard-limit/clip a level of high-level voltage transients or spikes in the AC signal according to embodiments presented herein. As used herein, the term "coupled to" (and similarly "connected to"), unless specified otherwise, covers an arrangement in which components or terminals/nodes are directly connected to each other, and an arrangement in which the components or terminals/nodes are indirectly connected to each other through one or more intermediate components.

Transformer 106 includes (i) a primary winding Lpri (also referred to as an "input coil") having a non-dot first terminal 110a and a dot second terminal 110b coupled to input stage 104, and (ii) a secondary winding Lsec (also referred to as an "output coil") having a non-dot first terminal 112a and a dot second terminal 112b coupled to rectifier 108 as input terminals to the rectifier, and (iii) a magnetic core C to couple the input coil to the output coil. A leakage inductance of transformer 106 is modeled by an inductor Lk coupled to second terminal 110b of transformer 106.

Input stage 104 includes a voltage rail 114 coupled to terminal 110b of transformer 106, and switch transistor M1

(which serves as a current switch) coupled to terminal 110*a*. Voltage rail 114 applies a constant voltage V1 to terminal 110*b*, and supplies or sources input current I (also referred to as a "transformer primary current" or a "transformer input current") to input coil Lpri under control of switch transistor M1 (referred to simply as "switch M1"). Specifically, switch M1 includes a controlled current path (i.e., a source-drain (S-D) path) coupled between terminal 110*a* of input coil Lpri and a return node RN of switching power supply system 100, such that the controlled current path and the input coil are connected in series with each other between voltage rail 114 and the return node. When ON, switch M1 sinks input current I from voltage rail 114 through input coil Lpri, and when OFF, the switch blocks the input current, i.e., I=0. In an example, switch M1 is a field effect transistor (FET), or any other type of transistor suited for current switching as described herein.

Switch M1 (and thus input current I) is switched ON and OFF responsive to a cyclic or periodic waveform W applied to a control terminal G (e.g., a gate) of the switch. Waveform W is configured to turn ON switch M1 (and input current I) for a first time period t1 and to turn OFF the switch (and the input current) for a second time period t2 following the first time period. Together, consecutive time periods t1 and t2 represent one switching cycle or one period of waveform W (and thus input current I), which establishes the following input current operation:

a. At the start of time period t1, switch M1 transitions (i.e., switches or cycles) from OFF to ON (referred to as an "OFF-ON transition") and remains ON for the time period. In response, input current I correspondingly transitions from OFF to ON at the start of time period t1, and remains ON for the time period.

b. At the start of time period t2, switch M1 transitions from ON to OFF (referred as an "ON-OFF transition") and remains OFF for the time period. In response, input current I correspondingly transitions from ON to OFF at the start of time period t2, and remains OFF for the time period. The cycle (a) then (b) repeats.

Responsive to the switching of input current I in input coil Lpri, output coil Lsec generates or produces an AC signal (including voltage and current) at/across terminals 112*a* and 112*b* of the output coil. The AC signal (also referred to as a "transformer secondary AC signal" or a "transformer output AC signal") is cyclical with a periodicity corresponding to that of input current I. As used herein the term "AC signal" refers generally to one or more AC signals or waveforms generated by output coil Lsec and applied across rectifier diodes (described below) of rectifier 108. The AC signal includes undesired high-level voltage transients or "spikes" having magnitudes that exceed a relatively flat peak portion of the AC signal, and which coincide with the above-mentioned ON/OFF transitions of input current I. Rectifier 108 rectifies and smooths the AC signal, to supply a rectified current and voltage Vout to output load Rload through an output node 120 of the rectifier that is coupled to the output load. In addition, voltage clamp 102 of rectifier 108 clamps (e.g., hard-limits or clips) peaks of the voltage transients to a clamp voltage established or derived by the voltage clamp, and thus reduces the effect of the voltage transients on the rectifier.

More specifically, rectifier 108 includes output load Rload coupled to output node 120 and return node RN (i.e., across the output node and the return node), an output capacitor Cout coupled to the output node and the return node, (i.e., across the output load), and an inductor Lout coupled to and between terminal 112*b* and the output node, and through which a rectified current flows. Rectifier 108 also includes back-to-back rectifier diodes rectifier1 (RD1) and rectifier2 (RD2) (also referred to simply as "rectifiers") to rectify first and second AC signal components of the AC signal that occur across rectifier diodes RD1 and RD2, respectively, to produce the rectified current. Rectifier diode RD1 has a cathode and an anode connected to terminal 112*a* (i.e., the non-dot terminal) and return node RN, respectively. Rectifier diode RD2 has a cathode and an anode connected to terminal 112*b* (i.e., the dot terminal) and return node RN, respectively. Thus, both rectifier diodes RD1 and RD2 have respective anodes connected back-to-back and to return node RN. Generally, (i) rectifier diode RD1 operates to supply the rectified current and voltage Vout to output node 120 when the input current I is ON in input coil Lpri during time period t1, and (ii) rectifier diode RD2 operates to supply the rectified current and voltage Vout to the output node 120 when the input current is OFF in the input coil during time period t2. Output capacitor Cout accumulates charge during rectifier cycles to help smooth rectified voltage Vout.

Voltage clamp 102 includes a first clamp diode D1, a second clamp diode D2, a capacitor C1, and a resistor R1 coupled to each other at an intermediate or common node CN of the voltage clamp. Capacitor C1 is coupled to return node RN and common node CN. First clamp diode D1 has a cathode and an anode respectively coupled to common node CN and terminal 112*a* (i.e., the non-dot terminal), while second clamp diode D2 has a cathode and an anode respectively coupled to the common node and terminal 112*b* (the dot terminal) and a first side of inductor Lout. Thus, first clamp diode D1 is connected in series with capacitor C1 from/between terminal 112*a* to return node RN, while second clamp diode D2 is connected in series with capacitor C1 from/between terminal 112*b* and return node RN. Resistor R1 is coupled to common node CN and output node 120. A second side of Lout is coupled to output node 120.

In operation, repeated switching cycles of input current I in input coil Lpri correspondingly produce cycles of the AC signal at terminals 112*a* and 112*b* of output coil Lsec. The AC signal includes the above-mentioned undesired high frequency, high-level voltage transients caused by the switching transitions of input current I. The voltage transients include (i) a first voltage transient that occurs at terminal 112*a* each time input current I transitions from ON to OFF (i.e., is switched OFF) in input coil Lpri, and (ii) a second voltage transient that occurs at terminal 112*b* each time the input current transitions from OFF to ON (i.e., is switched ON) in the input coil. The first voltage transient occurs across rectifier diode RD1 when rectifier diode RD2 is conducting, and the second voltage transient occurs across rectifier diode RD2 when rectifier diode RD1 is conducting.

Voltage clamp 102 derives or establishes a clamp voltage at which to clamp the level of the first and second voltage transients as follows. Initially, the first and second voltage transients forward bias/turn on clamp diodes D1 and D2, respectively, and charge capacitor C1 (and common node CN) up to a steady-state voltage through the forward-biased clamp diodes. A level of the steady-state voltage is set or tuned by resistor R1, which "bleeds" charge-off of capacitor C1 as a function of a resistance of the resistor. A relatively lower resistance reduces the voltage by bleeding-off more energy from capacitor C1, while a relatively higher resistance increases the voltage by bleeding-off less energy from the capacitor, which allows more charge to accumulate on the capacitor.

Capacitor C1 maintains the steady-state voltage at common node CN. Series-connected clamp diode D1 and capacitor C1 (connected between terminal 112a and return node RN) establish the clamp voltage for the first voltage transient as a sum of (i) the voltage across the capacitor, and (ii) the forward bias voltage of the clamp diode (i.e., a diode drop). Similarly, series-connected clamp diode D2 and capacitor C1 (connected between terminal 112b and return node RN) establish the clamp voltage for the second voltage transient as a sum of (i) the voltage across the capacitor, and (ii) the forward bias voltage of the clamp diode. The two clamp voltages are approximately equal to each other because the diode forward bias voltages are approximately the same as each other.

With respect to clamping operation, when the first voltage transient at terminal 112a is equal to or exceeds the clamp voltage established by series-connected capacitor C1 and clamp diode D1, the clamp diode becomes forward biased, i.e., turns ON. Consequently, series-connected clamp diode D1 and capacitor C1 provide a short-circuit path for the first voltage transient from terminal 112a to return node RN, where capacitor C1 acts as a voltage source (i.e., to establish the steady-state voltage and the common node) having a low-impedance to transient energy. Similarly, when the second voltage transient at terminal 112b is equal to or exceeds the clamp voltage established by series-connected capacitor C1 and clamp diode D2, the clamp diode becomes forward biased and turns ON. Consequently, series-connected clamp diode D2 and capacitor C1 provide a short-circuit path from terminal 112a to return node RN for the second voltage transient.

In this way, clamp diodes D1 and D2 (along with capacitor C1), clamp a level of the first and second voltage transients to the clamp voltage to reduce the effect of the voltage transients on rectifier 108. Some of the clamped energy (i.e., transient current flowing through the forward-biased clamp diodes) flows into resistor R1 rather than through capacitor C1. Resistor R1 dissipates a portion of that clamped energy as heat, but also advantageously harvests another portion (e.g., 20%) of that clamped energy by delivering it to output load Rload and output capacitor Cout through output node 120, which improves an overall power supply efficiency.

In an alternative arrangement or variation of voltage clamp 102, resistor R1 is connected from common node CN to return node RN (as shown in dashed line "alternate connection" in FIG. 1), instead of to output node 120. In this arrangement, resistor R1 dissipates all of the energy from the voltage transients.

Figure 2:
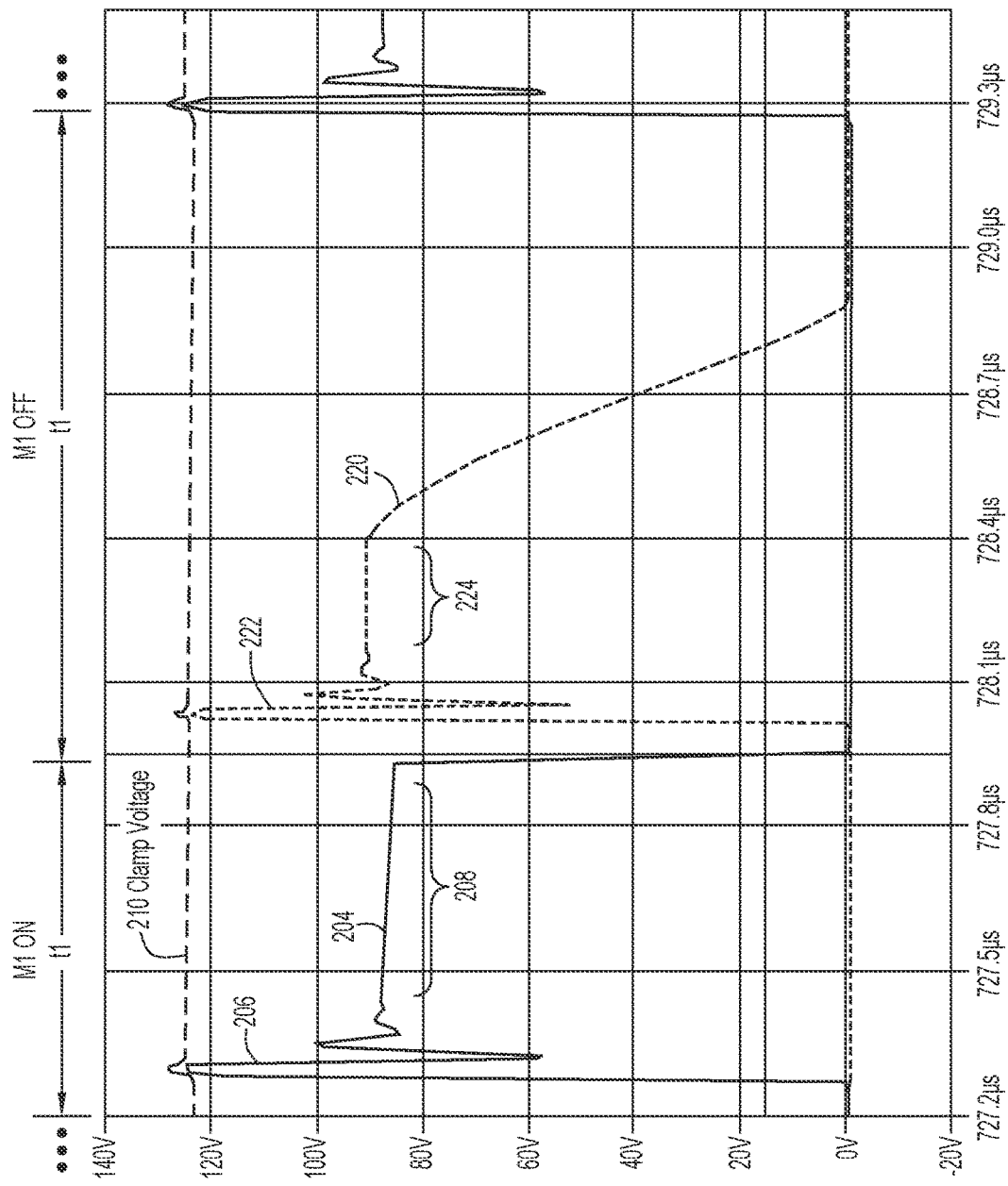
FIG. 2 shows example voltage waveforms for the AC signal according to an embodiment.
Figure 3:
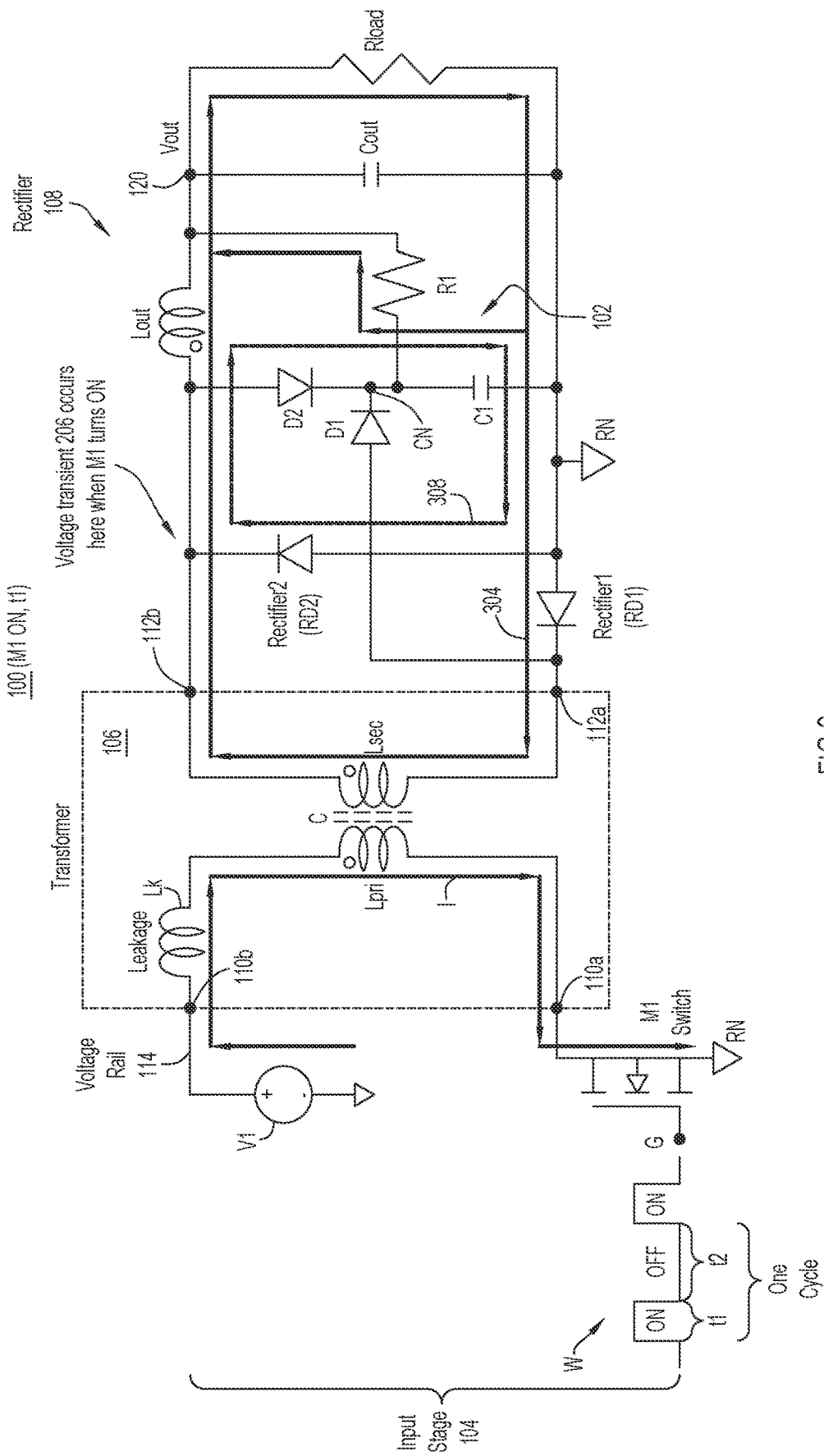
FIG. 3 is a schematic and current flow diagram for the switching power supply system when the input current is ON according to an example embodiment.

The operation of switching power supply system 100 is described in further detail with reference to FIGS. 2-4. FIG. 2 shows voltage waveforms of the AC signal across rectifier diodes RD1 and RD2 for successive time periods t1 and t2 of input current I in input coil Lpri, corresponding to when the input current is ON and OFF, respectively. FIG. 3 is a schematic and current flow diagram for switching power supply system 100 during time period t1 (i.e., when input current I is ON). In FIG. 3, voltage rail 114 is represented as a constant voltage source V1. The ensuing description may refer to circuit components simply by their designated alphanumeric labels. For example, "rectifier diode RD1" and "capacitor C1" may be referred to as "RD1" and "C1."

During time period t1, current flow in switching power supply system 100 is configured as shown in FIG. 3, and the operation of the switching power supply system proceeds as follows:

a. At the start of time period t1, M1 and input current I transition from OFF to ON (i.e., are switched ON) and remain ON until the end of time period t1. A voltage waveform 204 in FIG. 2 represents a voltage pulse of the AC signal produced across RD2 responsive to input current I. Voltage pulse 204 includes a leading-edge high-level voltage transient 206 that occurs at terminal 112b (across rectifier RD2) when input current I is switched ON, followed by a relatively flat peak 208 of the voltage pulse. Voltage transient 206 has a magnitude that exceeds that of flat peak 208.

b. RD1 is ON (i.e., forward biased and conducting), and supplies a rectified current 304 to output node 120, along a current path shown in FIG. 3.

c. RD2 is OFF (i.e., reversed biased by voltage transient 206 and voltage plateau 208).

d. C1 has been charged up to a clamp voltage of about 125 V, for example, (shown as clamp voltage 210 in FIG. 2) during previous cycles of the AC signal (not shown).

e. D2 and C1 clamp voltage transient 206 to the clamp voltage. A transient voltage clamp current 308 circulates through D2, C1, and RD2 during the clamping operation.

Figure 4:
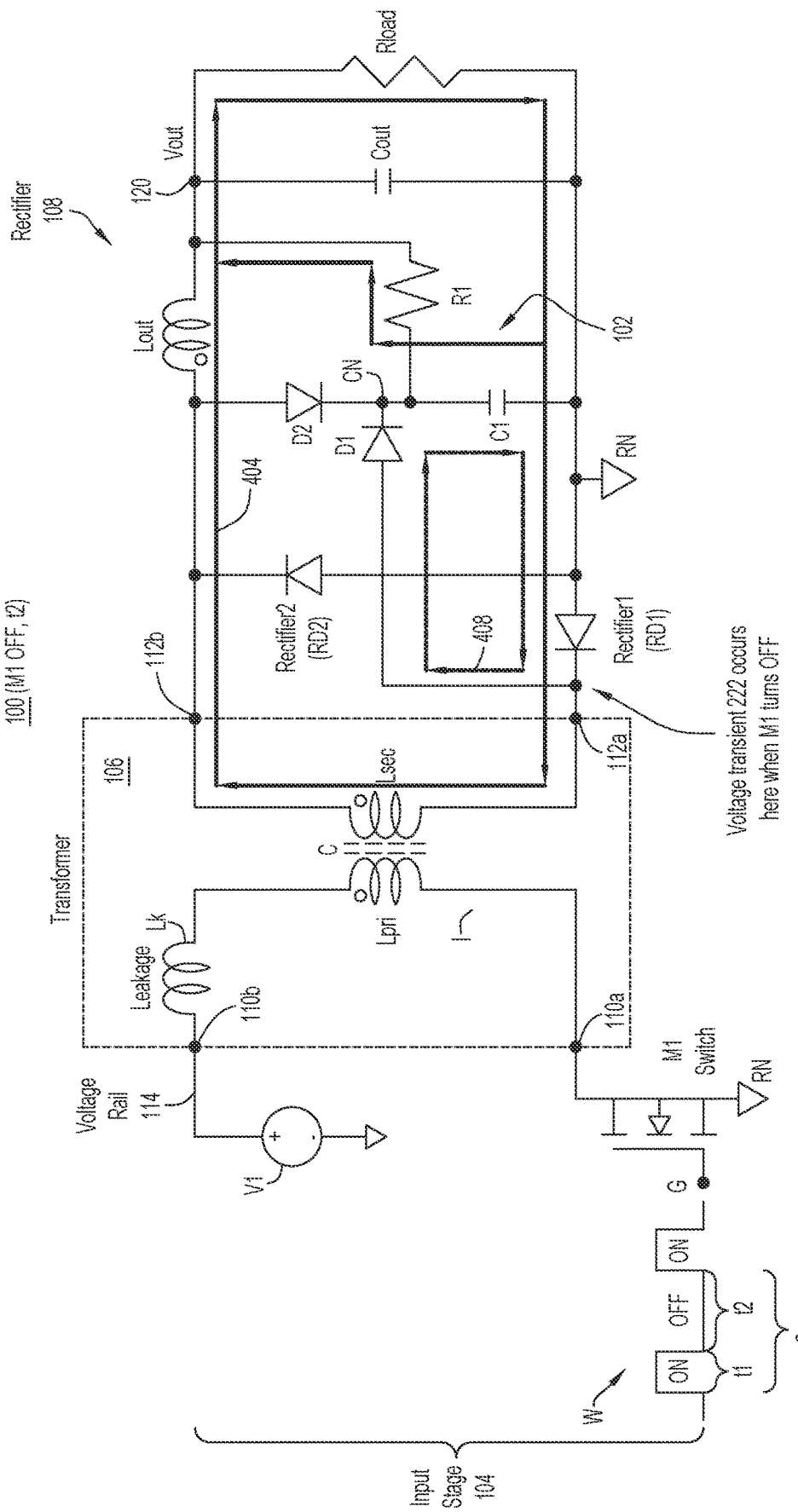
FIG. 4 is a schematic and current flow diagram for the switching power supply system when the input current is OFF according to an example embodiment.

FIG. 4 is a schematic and current flow diagram for switching power supply system 100 during time period t2 (i.e., when input current I is OFF). During time period t2, current flow in switching power supply system 100 is configured as shown in FIG. 4, and operation of system 100 proceeds as follows:

a. At the start of time period t2, M1 and input current I transition from ON to OFF (i.e., are switched OFF) and remain OFF until the end of time period t2. A voltage waveform 220 in FIG. 2 represents a voltage pulse of the AC signal across RD1 responsive to input current I. Voltage pulse 220 includes a leading-edge high-level voltage transient 222 produced at terminal 112a when input current I is switched OFF, followed by a relatively flat peak 224 of the voltage pulse. Voltage transient 222 has a magnitude that exceeds that of flat peak 224.

b. RD1 is OFF (i.e., reversed biased by voltage transient 222 and voltage plateau 224).

c. RD2 is ON (i.e., forward biased and conducting), and supplies a rectified current 404 to output node 120, along a current path shown in FIG. 4.

d. C1 has been charged up to the clamp voltage.

e. D1 and C1 clamp voltage transient 222 to the clamp voltage. A transient voltage clamp current 408 circulates through D1, C1, and RD1 during the clamping operation.

The events above-described events for time periods t1 and t2 repeat every switching cycle of input current I.

In summary, rectifier 108 rectifies (and clamps voltage transients of) the AC signal produced by output coil Lsec of transformer 106 in response to switching of input current I in input coil Lpri of the transformer. Rectifier 108 includes:

a. Output node 120 and return node RN coupled to output load Rload.

b. First rectifier RD1, coupled to first terminal 112a of output coil Lsec and return node RN, to rectify the AC signal and supply a rectified current to output node 120 when the input current is ON.

c. Second rectifier RD2, coupled to second terminal 112b of output coil Lsec and return node RN, to rectify the AC signal and supply a rectified current to output node 120 when input current I is OFF.

d. Voltage clamp 102, including first clamp diode D1, second clamp diode D2, and capacitor C1 coupled to each other at a common node of the voltage clamp, to clamp, to a clamp voltage set by capacitor C1 (in addition to either of the clamp diodes), a level of a first voltage transient and a level of a second voltage transient of the AC signal that occur at first terminal 112a and second terminal 112b when input current I is switched OFF and ON (i.e., transitions from ON-to-OFF and from OFF-to-ON), respectively.

i. The first clamp diode D1 and the capacitor C1 are connected in series from the first terminal 112a to the return node RN and are configured to (i) establish the clamp voltage as a sum of a voltage across the capacitor and a forward bias voltage of the first clamp diode, and (ii) clamp a level of the first voltage transient to the clamp voltage. When the level of the first voltage transient is equal to or exceeds the clamp voltage, the first clamp diode and the capacitor are configured to form a short-circuit path to conduct transient current from the first terminal to the return node.
  ii. The second clamp diode D2 and the capacitor C1 are connected in series with each other from the second terminal 112b to the return node RN and are configured to (i) establish the clamp voltage as a sum of the voltage across the capacitor and a forward bias voltage of the second clamp diode, and (ii) clamp a level of the second voltage transient to the clamp voltage. When the level of the second voltage transient exceeds the clamp voltage, the second clamp diode and the capacitor are configured to form a short-circuit path to conduct transient current from the second terminal to the return node.
  iii. Voltage clamp 102 also includes resistor R1, coupled to first clamp diode D1, second clamp diode D2, and capacitor C1 at the common node, and also coupled to the output node, to set the voltage across the capacitor to control or tune the clamp voltage, and to supply a portion of clamped energy to the output node during clamping operation of each of the clamp diodes.

Advantages of rectifier 108 and voltage clamp 102 include, but are not limited to, the following: connecting RD1 to the non-dot terminal and connecting both RD1 and RD2 to the return node make it possible for RD1 and RD2 to share the voltage clamp components; the position of D1 in the circuit allows RD1 and RD2 to share the voltage clamp components. Both RD1 and RD2 charge C1, which increases a switching frequency of C1 (compared to when only one rectifier charges C1), allowing reduced capacitance and physical size of the capacitor.

Figure 5:
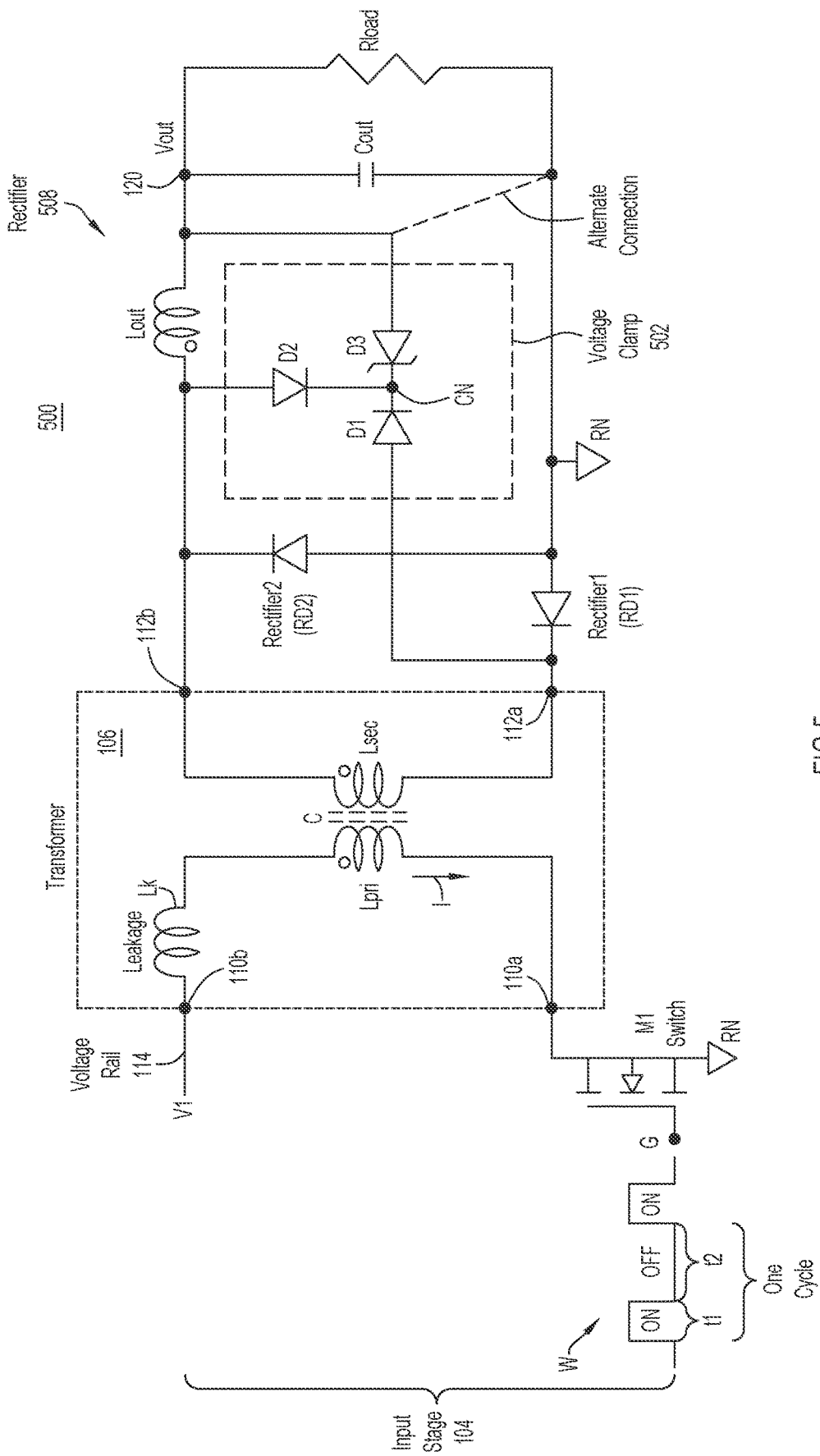
FIG. 5 is a schematic diagram of an example switching power supply system having a voltage clamp according to a second embodiment.

FIG. 5 is a schematic diagram of an example switching power supply system 500 in which an example voltage clamp 502 according to a second embodiment may be implemented. Switching power supply system 500 is substantially the same as switching power supply system 100, except that switching power supply system 500 includes a rectifier 508 that includes voltage clamp 502 instead of voltage clamp 102. Accordingly, the above description of portions of switching power supply system 100 that are common to switching power supply system 500 shall suffice for the latter.

Voltage clamp 502 includes a Zener diode D3 that replaces both capacitor C1 and resistor R1 of voltage clamp 102. Zener diode D3 has an anode and a cathode coupled to output node 120 (and inductor Lout and capacitor Cout) and common node CN, respectively. Output capacitor Cout and Zener diode D3 are connected in series with each other between return node RN and common node CN. Clamp diode D1 and Zener diode D3 are connected in series with each other from terminal 112a to output node 120, while clamp diode D2 and Zener diode D3 are connected in series with each other from terminal 112b to output node 120 in parallel with inductor Lout.

Thus, capacitor Cout (which establishes voltage Vout at output node 120), Zener diode D3, and either clamp diode D1 or D2 collectively establish the clamp voltage for the first and second transients. Specifically, the clamp voltage for the first voltage transient that occurs at terminal 112a is a sum of (i) voltage Vout at output node 120 (i.e., the voltage across capacitor Cout), (ii) a breakdown voltage Vz of Zener diode D3 (also referred to as the "Zener voltage"), and (iii) the forward bias voltage for clamp diode D1. Similarly, the clamp voltage for the second voltage transient that occurs at terminal 112b is a sum of (i) voltage Vout at output node 120 (i.e., the voltage across capacitor Cout), (ii) the breakdown voltage of Zener diode D3, and (iii) the forward bias voltage for clamp diode D2. Similar to voltage clamp 102, during clamping, voltage clamp 502 injects or harvests transient voltage energy into output capacitor Cout and output load Rload through clamp diodes D1 and D2 and Zener diode D3.

In an alternative arrangement of voltage clamp 502, the anode of Zener diode D3 is connected to return node RN (as shown in dashed line in FIG. 5) instead of output node 120. This arrangement dissipates more power because it does not inject (harvest) any transient voltage energy into Cout and Rload. The clamp voltage of this arrangement is the forward voltage drop of either D1 or D2 plus the breakdown voltage of Zener D3.

Figure 6:
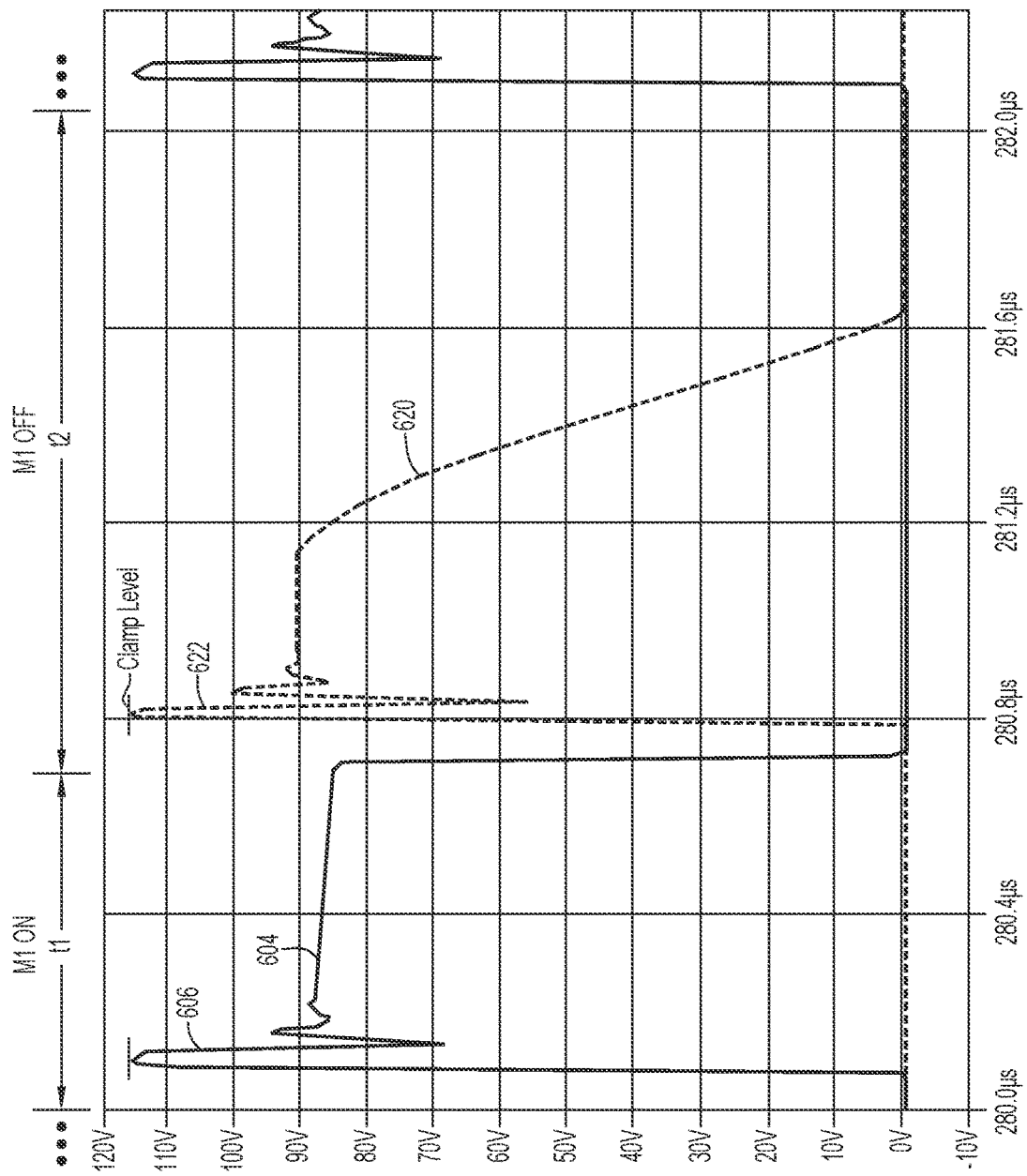
FIG. 6 shows example voltage waveforms for the AC signal in the switching power supply system of FIG. 5 according to an embodiment.
Figure 7:
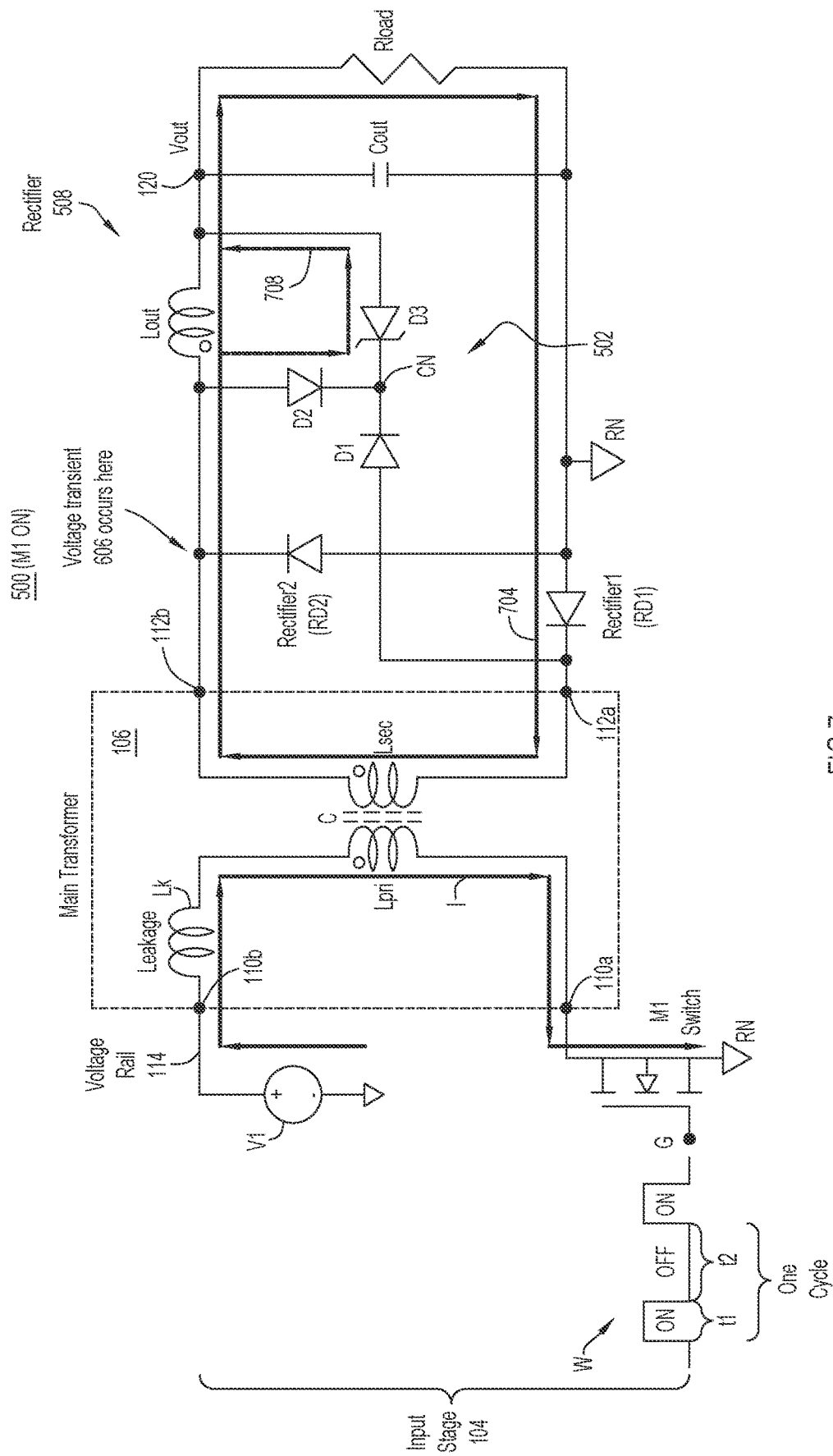
FIG. 7 is a schematic and current flow diagram for the switching power supply system of FIG. 5 when the input current in the input coil of the transformer is ON according to an example embodiment.
Figure 8:
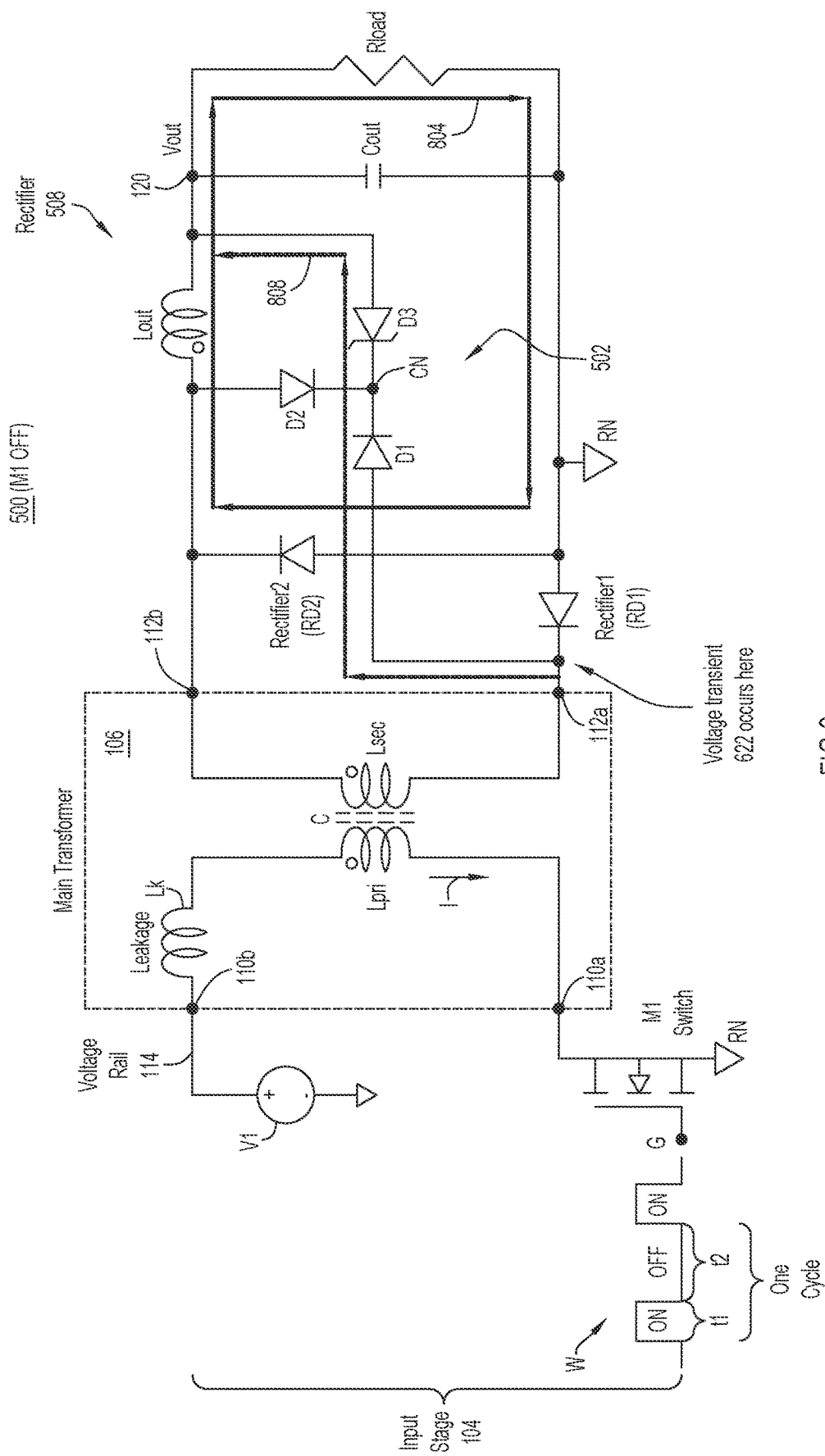
FIG. 8 is a schematic and current flow diagram for the switching power supply system of FIG. 5 when the input current is OFF according to an example embodiment.

The operation of switching power supply system 500 is now described further with reference to FIGS. 6-8. Similar to FIG. 2, FIG. 6 shows voltage waveforms across RD1 and RD2 for successive time periods t1 and t2 of input current I in input coil Lpri, corresponding to when the input current is ON and OFF, respectively. FIG. 7 is a schematic and current flow diagram for switching power supply system 500 during time period t1 (i.e., when input current I is ON).

During time period t1, current flow in switching power supply system 500 is configured as shown in FIG. 7, and the operation of system 500 proceeds as follows:

a. At the start of time period t1, M1 and input current I transition from OFF to ON and remain ON for the period. As shown in FIG. 6, voltage pulse 604 represents the AC signal produced across RD2 responsive to input current I. Voltage pulse 604 includes a leading-edge relatively high-level voltage transient 606 that occurs at terminal 112b when input current I is switched ON. Voltage transient 606 is shown in its clamped configuration, i.e., after clamping (see (d) and (e) below).
  b. RD1 is ON, and supplies a rectified current 704 to output node 120, along a current path shown in FIG. 7.
  c. RD2 is OFF (i.e., reversed biased with voltage transient 606 and the voltage plateau in 604).
  d. A transient voltage clamp level for RD2=D2 forward bias voltage+D3 Zener break down voltage+Vout (across Cout) (e.g., about 115V in the example of FIG. 7).
  e. D2, D3, and Cout clamp voltage transient 606 to the clamp voltage (from (d)). A transient voltage clamp current circulates along path 708 during the clamping operation, i.e., during voltage transient 606. The transient current is stored in Cout and delivered to Rload, improving power supply efficiency by harvesting some of the transient voltage energy.

FIG. 8 is a schematic and current flow diagram for switching power supply system 500 during time period t2 (i.e., when input current I is OFF). During time period t2, current flow in switching power supply system 500 is configured as shown in FIG. 8, and operation of system 500 proceeds as follows:

a. At the start of time period t2, M1 and input current I transition from ON to OFF and remain OFF until the end of the time period. As shown in FIG. 6, voltage pulse 620 represents the AC signal across RD1 responsive to input current I. Voltage pulse 620 includes a leading-edge relatively high-level voltage transient 622 (shown in FIG. 6) at terminal 112a produced when input current I is switched OFF. Voltage transient 622 is shown in its clamped configuration, i.e., after clamping (see (d) and (e) below).

b. RD1 is OFF (i.e., reversed biased with voltage transient 622 and voltage plateau 604).

c. RD2 is ON (i.e., forward biased and conducting), and supplies a rectified current 804 to output node 120, along a current path shown in FIG. 8.

d. A transient voltage clamp level for RD1=D1 forward bias voltage+D3 Zener break down voltage+Vout (across Cout) (e.g., about 115 V).

e. D1, D3, and Cout clamp voltage transient 622 to the clamp voltage (from (d)). A transient voltage clamp current flows along path 808 from terminal 112a to output node 120 during voltage transient 622. The transient current is stored in Cout and delivered to Rload, improving power supply efficiency by harvesting some of the transient voltage energy.

The events above-described events for time periods t1 and t2 repeat every switching cycle of input current I.

In summary, rectifier 508 rectifies and clamps the AC signal produced by output coil Lsec of transformer 106 in response to input current I in input coil Lpri of the transformer. Rectifier 508 includes:

a. Output node 120 and return node RN coupled to opposing sides of output load Rload.

b. First rectifier RD1, coupled to first terminal 112a of the output coil Lsec and the return node, to rectify the AC signal to supply a rectified current to the output node when the input current is ON.

c. Second rectifier RD2, coupled to second terminal 112b of the output coil and the return node, to rectify the AC signal to supply a rectified current to the output node when the input current is OFF.

d. Voltage clamp 502, including first clamp diode D1, second clamp diode D2, and Zener diode D3 coupled to each other (at common node CN), and configured to clamp, to a clamp voltage set by the Zener diode (e.g., by the breakdown voltage of the Zener diode), a first voltage transient and a second voltage transient of the AC signal that occur at the first terminal and the second terminal when the input current is switched OFF and ON, respectively.

i. The first clamp diode and the Zener diode are connected in series with each other from the first terminal to the output node and are configured to (i) establish the clamp voltage as a sum of a voltage at the output node (established as a voltage across output capacitor Cout coupled across the output node and the return node), a breakdown voltage of the Zener diode, and a forward bias voltage of the first clamp diode, and (ii) clamp a level of the first voltage transient to the clamp voltage.

ii. The second clamp diode and the Zener diode are connected in series with each other from the second terminal to the output node and are configured to (i) establish the clamp voltage as a sum of a voltage at the output node, a breakdown voltage of the Zener diode, and a forward bias voltage of the second clamp diode, and (ii) clamp a level of the second voltage transient to the clamp voltage.

Figure 9:
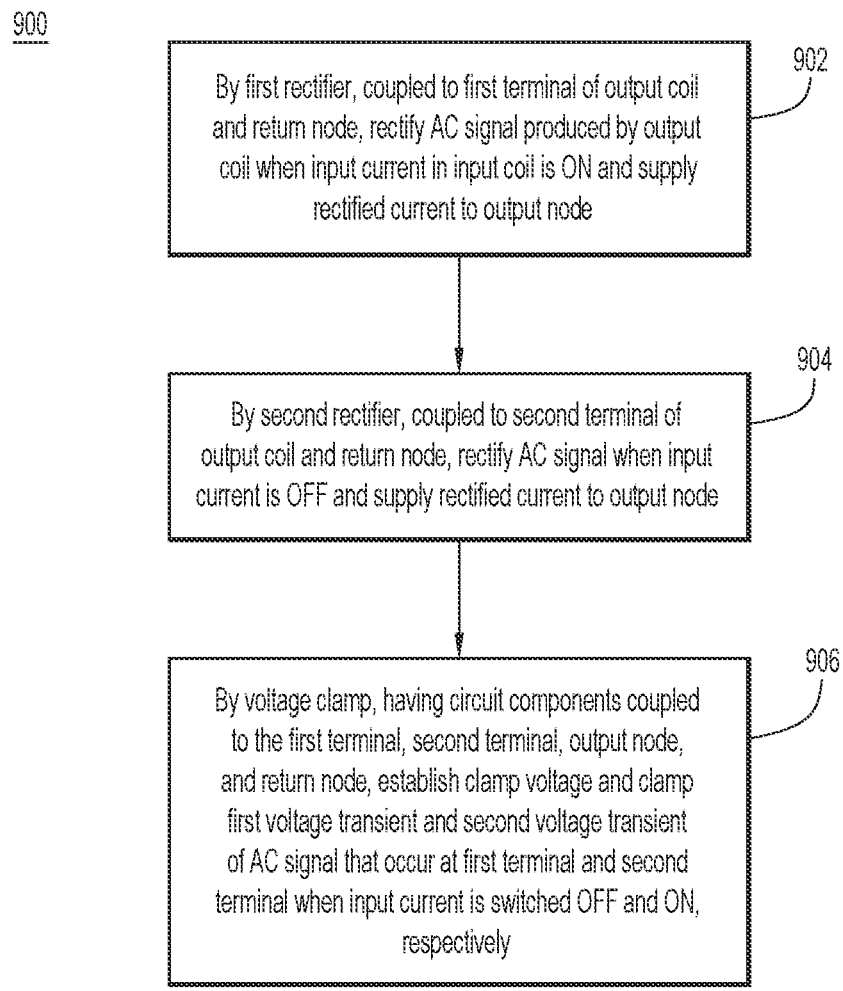
FIG. 9 is a flowchart of an example method of rectifying and clamping the AC signal produced by the output coil of the transformer in response to the input current in the input coil of the transformer according to an example embodiment.

FIG. 9 is a flowchart of an example method 900 of rectifying and clamping an AC signal produced by an output coil (e.g., Lsec) of a transformer (e.g., 106) in response to a switched input current in an input coil (e.g., Lpri) of the transformer, performed by a rectifier (e.g., rectifier 108 or 508). The output coil includes a first terminal and a second terminal that provide the AC signal to the rectifier, thus the first terminal and the second terminal serve as input terminals of the rectifier that receive the AC signal. The rectifier includes an output node and a return node to be coupled to an output load (e.g., Rload).

At 902, a first rectifier, coupled to a first terminal of the output coil and the return node, rectifies the AC signal to supply a rectified current to the output node when the input current is ON.

At 904, a second rectifier, coupled to a second terminal of the output coil and the return node, rectifies the AC signal to supply a rectified current to the output node when the input current is OFF.

At 906, a voltage clamp, having circuit components coupled to the first terminal, the second terminal, the output node, and the return node, establishes or derives a clamp voltage and clamps or limits a first voltage transient and a second voltage transient of the AC signal that occurs at the first terminal and the second terminal when the input current is switched OFF and ON, respectively. In a first embodiment, the voltage clamp includes a first clamp diode, a second clamp diode, a capacitor, and a resistor coupled to each other at a common node of the voltage clamp. In a second embodiment the voltage clamp incudes a first clamp diode, a second clamp diode, and a Zener diode coupled to each other at the common node.

In summary, in some aspects, the techniques described herein relate to a circuit to rectify an alternating current (AC) signal produced by an output coil of a transformer in response to an input current in an input coil of the transformer, including: an output node and a return node to be coupled to an output load; a first rectifier, coupled to a first terminal of the output coil and the return node, to rectify the AC signal to supply a current to the output node when the input current is ON; a second rectifier, coupled to a second terminal of the output coil and the return node, to rectify the AC signal to supply a current to the output node when the input current is OFF; and a voltage clamp, including a first clamp diode, a second clamp diode, and a capacitor coupled to each other, and configured to clamp, to a clamp voltage set by the capacitor, a first voltage transient and a second voltage transient of the AC signal that occur at the first terminal and the second terminal when the input current is switched OFF and switched ON, respectively.

In some aspects, the techniques described herein relate to a circuit, wherein: the first rectifier includes a first diode having an anode and a cathode coupled to the return node and the first terminal, respectively; and the second rectifier includes a second diode having an anode and a cathode coupled to the return node and the second terminal, respectively.

In some aspects, the techniques described herein relate to a circuit, wherein: the first clamp diode and the capacitor are connected in series from the first terminal to the return node and are configured to (i) establish the clamp voltage as a sum of a voltage across the capacitor and a forward bias voltage of the first clamp diode, and (ii) clamp a level of the first voltage transient to the clamp voltage.

In some aspects, the techniques described herein relate to a circuit, wherein: when the level of the first voltage transient exceeds the clamp voltage, the first clamp diode and the capacitor are configured to conduct transient current from the first terminal to the return node.

In some aspects, the techniques described herein relate to a circuit, wherein: the capacitor is coupled to the return node and a common node of the voltage clamp; and the first clamp diode includes an anode and a cathode coupled to the first terminal and the common node, respectively.

In some aspects, the techniques described herein relate to a circuit, wherein the voltage clamp further includes: a resistor, coupled to the common node and the output node, to set the voltage across the capacitor, and to supply a portion of clamped energy to the output node.

In some aspects, the techniques described herein relate to a circuit, wherein: the second clamp diode and the capacitor are connected in series with each other from the second terminal to the return node and are configured to (i) establish the clamp voltage as a sum of a voltage across the capacitor and a forward bias voltage of the second clamp diode, and (ii) clamp a level of the second voltage transient to the clamp voltage.

In some aspects, the techniques described herein relate to a circuit, wherein: when the level of the second voltage transient exceeds the clamp voltage, the second clamp diode and the capacitor are configured to conduct transient current from the second terminal to the return node.

In some aspects, the techniques described herein relate to a circuit, wherein: the capacitor is coupled to the return node and a common node of the voltage clamp; and the second clamp diode includes an anode and a cathode coupled to the second terminal and the common node, respectively.

In some aspects, the techniques described herein relate to a circuit, wherein the voltage clamp further includes: a resistor, coupled to the common node and the output node, to set the voltage across the capacitor, and to supply a portion of clamped energy to the output node.

In some aspects, the techniques described herein relate to a circuit, wherein: the capacitor is coupled to a common node of the voltage clamp and the return node, the first clamp diode is coupled to the common node and the first terminal and is configured to clamp the first voltage transient, and the second clamp diode is coupled to the common node and the second terminal and is configured to clamp the second voltage transient.

In some aspects, the techniques described herein relate to a circuit, wherein the first terminal and the second terminal are a non-dot terminal and a dot terminal of the transformer, respectively.

In some aspects, the techniques described herein relate to a circuit to rectify an alternating current (AC) signal produced by an output coil of a transformer in response to an input current in an input coil of the transformer, including: an output node and a return node to be coupled to opposing sides of an output load; a first rectifier, coupled to a first terminal of the output coil and the return node, to rectify the AC signal to supply a current to the output node when the input current is ON; a second rectifier, coupled to a second terminal of the output coil and the return node, to rectify the AC signal to supply current to the output node when the input current is OFF; and a voltage clamp, including a first clamp diode, a second clamp diode, and a Zener diode coupled to each other, and configured to clamp, to a clamp voltage set by the Zener diode, a first voltage transient and a second voltage transient of the AC signal that occur at the first terminal and the second terminal when the input current is switched OFF and switched ON, respectively.

In some aspects, the techniques described herein relate to a circuit, wherein: the first rectifier includes a first diode having an anode and a cathode coupled to the return node and the first terminal, respectively; and the second rectifier includes a second diode having an anode and a cathode coupled to the return node and the second terminal, respectively.

In some aspects, the techniques described herein relate to a circuit, wherein: the first clamp diode and the Zener diode are connected in series with each other from the first terminal to the output node and are configured to (i) establish the clamp voltage as a sum of a voltage at the output node, a breakdown voltage of the Zener diode, and a forward bias voltage of the first clamp diode, and (ii) clamp a level of the first voltage transient to the clamp voltage.

In some aspects, the techniques described herein relate to a circuit, further including: an output capacitor coupled across the return node and the output node and configured to establish the voltage at the output node.

In some aspects, the techniques described herein relate to a circuit, wherein: the Zener diode is coupled to a common node of the voltage clamp and the output node; and the first clamp diode includes an anode and a cathode coupled to the first terminal and the common node, respectively.

In some aspects, the techniques described herein relate to a circuit, wherein: the second clamp diode and the Zener diode are connected in series with each other from the second terminal to the output node and are configured to (i) establish the clamp voltage as a sum of a voltage at the output node, a breakdown voltage of the Zener diode, and a forward bias voltage of the second clamp diode, and (ii) clamp a level of the second voltage transient to the clamp voltage.

In some aspects, the techniques described herein relate to a circuit, wherein: the Zener diode is coupled to a common node of the voltage clamp and the output node; and the second clamp diode includes an anode and a cathode coupled to the second terminal and the common node, respectively.

In some aspects, the techniques described herein relate to a circuit, wherein: the Zener diode is coupled to a common node of the voltage clamp and the output node, the first clamp diode is coupled to the common node and the first terminal and is configured to clamp the first voltage transient, and the second clamp diode is coupled to the common node and the second terminal and is configured to clamp the second voltage transient.

The above description is intended by way of example only. Although the techniques are illustrated and described herein as embodied in one or more specific examples, it is nevertheless not intended to be limited to the details shown, since various modifications and structural changes may be made within the scope and range of equivalents of the claims.

What is claimed is:

1. A circuit to rectify an alternating current (AC) signal produced by an output coil of a transformer in response to an input current in an input coil of the transformer, comprising:
    an output node and a return node to be coupled to an output load;

a first rectifier, coupled to a first terminal of the output coil and the return node, to rectify the AC signal to supply a current to the output node when the input current is ON;

a second rectifier, coupled to a second terminal of the output coil and the return node, to rectify the AC signal to supply a current to the output node when the input current is OFF; and a voltage clamp, including a first clamp diode, a second clamp diode, and a capacitor coupled to each other, and configured to clamp, to a clamp voltage set by the capacitor, a first voltage transient and a second voltage transient of the AC signal that occur at the first terminal and the second terminal when the input current is switched OFF and switched ON, respectively, wherein the first clamp diode and the capacitor are connected in series from the first terminal to the return node and are configured to (i) establish the clamp voltage as a sum of a voltage across the capacitor and a forward bias voltage of the first clamp diode, and (ii) clamp a level of the first voltage transient to the clamp voltage.

2. The circuit of claim 1, wherein:
the first rectifier includes a first diode having an anode and a cathode coupled to the return node and the first terminal, respectively; and
the second rectifier includes a second diode having an anode and a cathode coupled to the return node and the second terminal, respectively.

3. The circuit of claim 1, wherein:
when the level of the first voltage transient exceeds the clamp voltage, the first clamp diode and the capacitor are configured to conduct transient current from the first terminal to the return node.

4. The circuit of claim 1, wherein:
the capacitor is coupled to the return node and a common node of the voltage clamp; and
the first clamp diode includes an anode and a cathode coupled to the first terminal and the common node, respectively.

5. The circuit of claim 4, wherein the voltage clamp further includes:
a resistor, coupled to the common node and the output node, to set the voltage across the capacitor, and to supply a portion of clamped energy to the output node.

6. The circuit of claim 1, wherein:
the second clamp diode and the capacitor are connected in series with each other from the second terminal to the return node and are configured to (iii) establish the clamp voltage as a sum of a voltage across the capacitor and a forward bias voltage of the second clamp diode, and (iv) clamp a level of the second voltage transient to the clamp voltage.

7. The circuit of claim 6, wherein:
when the level of the second voltage transient exceeds the clamp voltage, the second clamp diode and the capacitor are configured to conduct transient current from the second terminal to the return node.

8. The circuit of claim 6, wherein:
the capacitor is coupled to the return node and a common node of the voltage clamp; and
the second clamp diode includes an anode and a cathode coupled to the second terminal and the common node, respectively.

9. The circuit of claim 8, wherein the voltage clamp further includes:

a resistor, coupled to the common node and the output node, to set the voltage across the capacitor, and to supply a portion of clamped energy to the output node.

10. The circuit of claim 1, wherein:
the capacitor is coupled to a common node of the voltage clamp and the return node, the first clamp diode is coupled to the common node and the first terminal and is configured to clamp the first voltage transient, and the second clamp diode is coupled to the common node and the second terminal and is configured to clamp the second voltage transient.

11. The circuit of claim 1, wherein the first terminal and the second terminal are a non-dot terminal and a dot terminal of the transformer, respectively.

12. A circuit to rectify an alternating current (AC) signal produced by an output coil of a transformer in response to an input current in an input coil of the transformer, comprising:

an output node and a return node to be coupled to opposing sides of an output load;

a first rectifier, coupled to a first terminal of the output coil and the return node, to rectify the AC signal to supply a current to the output node when the input current is ON;

a second rectifier, coupled to a second terminal of the output coil and the return node, to rectify the AC signal to supply current to the output node when the input current is OFF; and a voltage clamp, including a first clamp diode, a second clamp diode, and a Zener diode coupled to each other, and configured to clamp, to a clamp voltage set by the Zener diode, a first voltage transient and a second voltage transient of the AC signal that occur at the first terminal and the second terminal when the input current is switched OFF and switched ON, respectively, wherein the first clamp diode and the Zener diode are connected in series with each other from the first terminal to the output node and are configured to (i) establish the clamp voltage as a sum of a voltage at the output node, a breakdown voltage of the Zener diode, and a forward bias voltage of the first clamp diode, and (ii) clamp a level of the first voltage transient to the clamp voltage.

13. The circuit of claim 12, wherein:
the first rectifier includes a first diode having an anode and a cathode coupled to the return node and the first terminal, respectively; and
the second rectifier includes a second diode having an anode and a cathode coupled to the return node and the second terminal, respectively.

14. The circuit of claim 12, further comprising:
an output capacitor coupled across the return node and the output node and configured to establish the voltage at the output node.

15. The circuit of claim 12, wherein:
the Zener diode is coupled to a common node of the voltage clamp and the output node; and
the first clamp diode includes an anode and a cathode coupled to the first terminal and the common node, respectively.

16. The circuit of claim 12, wherein:
the second clamp diode and the Zener diode are connected in series with each other from the second terminal to the output node and are configured to (iii) establish the clamp voltage as a sum of a voltage at the output node, the breakdown voltage of the Zener diode, and a forward bias voltage of the second clamp diode, and (iv) clamp a level of the second voltage transient to the clamp voltage.

17. The circuit of claim 16, wherein:
the Zener diode is coupled to a common node of the voltage clamp and the output node; and
the second clamp diode includes an anode and a cathode coupled to the second terminal and the common node, respectively.

18. The circuit of claim 16, wherein:
the Zener diode is coupled to a common node of the voltage clamp and the output node, the first clamp diode is coupled to the common node and the first terminal and is configured to clamp the first voltage transient, and the second clamp diode is coupled to the common node and the second terminal and is configured to clamp the second voltage transient.

19. A circuit to rectify an alternating current (AC) signal produced by an output coil of a transformer in response to an input current in an input coil of the transformer, comprising:
an output node and a return node to be coupled to an output load;
a first rectifier, coupled to a first terminal of the output coil and the return node, to rectify the AC signal to supply a current to the output node when the input current is ON;
a second rectifier, coupled to a second terminal of the output coil and the return node, to rectify the AC signal to supply a current to the output node when the input current is OFF; and
a voltage clamp, including a first clamp diode, a second clamp diode, and a capacitor coupled to each other, and configured to clamp, to a clamp voltage set by the capacitor, a first voltage transient and a second voltage transient of the AC signal that occur at the first terminal and the second terminal when the input current is switched OFF and switched ON, respectively,
wherein the second clamp diode and the capacitor are connected in series with each other from the second terminal to the return node and are configured to (i) establish the clamp voltage as a sum of a voltage across the capacitor and a forward bias voltage of the second clamp diode, and (ii) clamp a level of the second voltage transient to the clamp voltage.

* * * * *